(12) United States Patent
Young et al.

(10) Patent No.: US 6,720,090 B2
(45) Date of Patent: Apr. 13, 2004

(54) ORGANIC LIGHT EMITTING DIODE DEVICES WITH IMPROVED LUMINANCE EFFICIENCY

(75) Inventors: Ralph H. Young, Rochester, NY (US); Jianmin Shi, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/753,091

(22) Filed: Jan. 2, 2001

(65) Prior Publication Data

US 2002/0127427 A1 Sep. 12, 2002

(51) Int. Cl.[7] .............................................. H05B 33/14
(52) U.S. Cl. ................. 428/690; 428/917; 428/704; 313/504; 313/506; 252/301.16; 252/301.26; 257/40; 257/103
(58) Field of Search ............... 428/690, 917, 428/704; 313/504, 506; 252/301.16, 301.26; 257/40, 103

(56) References Cited

U.S. PATENT DOCUMENTS

| | | | |
|---|---|---|---|
| 4,720,432 A | | 1/1988 | VanSlyke et al. |
| 4,769,292 A | | 9/1988 | Tang et al. |
| 5,141,671 A | | 8/1992 | Bryan et al. |
| 5,281,489 A | * | 1/1994 | Mori et al. ................. 428/690 |
| 5,593,788 A | | 1/1997 | Shi et al. |
| 5,776,622 A | | 7/1998 | Hung et al. |
| 5,908,581 A | | 6/1999 | Chen et al. |
| 5,935,720 A | * | 8/1999 | Chen et al. ................. 428/690 |
| 6,020,078 A | * | 2/2000 | Chen et al. ................. 428/690 |
| 6,361,886 B2 | * | 3/2002 | Shi et al. ..................... 428/690 |
| 2002/0048688 A1 | | 4/2002 | Fukuoka et al. ............. 428/690 |

FOREIGN PATENT DOCUMENTS

| | | |
|---|---|---|
| EP | 1 162 674 A2 | 12/2001 |
| JP | 11-273861 | 10/1999 |
| WO | WO 99/53724 | 10/1999 |

* cited by examiner

Primary Examiner—Deborah Jones
Assistant Examiner—Ling X Xu
(74) Attorney, Agent, or Firm—Raymond L. Owens (57) ABSTRACT

An organic light emitting device includes a substrate, an anode and a cathode disposed over the substrate; a luminescent layer disposed between the anode and the cathode wherein the luminescent layer includes a host and at least one dopant; the host of the luminescent layer being selected to include a solid organic material comprising a mixture of at least two components wherein the first component of the mixture is an organic compound that is capable of transporting both electrons and holes and that is substantially non-polar; and the second component of the mixture is an organic compound that is more polar than the first component; and the dopant of the luminescent layer being selected to produce light from the light emitting device.

19 Claims, 3 Drawing Sheets

ORGANIC LIGHT EMITTING DIODE DEVICES WITH IMPROVED LUMINANCE EFFICIENCY

FIELD OF THE INVENTION

The present invention relates to organic light emitting diode devices and more particularly to the design of the composition of the organic layers for improvements in luminance efficiency.

BACKGROUND OF THE INVENTION

Organic light emitting diodes (OLED), also known as organic electroluminescent (EL) devices, are a class of electronic devices that emit light in response to an electrical current applied to the device. The structure of an OLED device generally includes an anode, an organic EL medium, and a cathode. The term, organic EL medium, herein refers to organic materials or layers of organic materials disposed between the anode and the cathode in the OLED device. The organic EL medium may include low molecular weight compounds, high molecular weight polymers, oligimers of low molecular weight compounds, or biomaterials, in the form of a thin film or a bulk solid. The medium can be amorphous or crystalline. Organic electroluminescent media of various structures have been described in the prior art. Dresner, in RCA Review, 30, 322 (1969), described a medium comprising a single layer of anthracene film. Tang et al, in Applied Physics Letters, 51, 913 (1987), Journal of Applied Physics, 65, 3610 (1989), and commonly-assigned U.S. Pat. No. 4,769,292, reported an EL medium with a multi-layer structure of organic thin films, and demonstrated highly efficient OLED devices using such a medium. In some OLED device structures the multi-layer EL medium includes a hole transport layer adjacent to the anode, an electron transport layer adjacent to the cathode, and disposed in between these two layers, a luminescent layer. Furthermore, in some preferred device structures, the luminescent layer is constructed of a doped organic film comprising an organic material as the host and a small concentration of a fluorescent compound as the dopant. Improvements in EL efficiency and chromaticity have been obtained in these doped OLED devices by selecting an appropriate dopant-host composition. Often, the dopant, being the dominant emissive center, is selected to produce the desirable EL colors. Examples of the doped luminescent layer reported by Tang et al. in commonly-assigned U.S. Pat. No. 4,769,292 and by Chen et. al in commonly-assigned U.S. Pat. No. 5,908,581 are: tris(8-quinolinol)aluminum (AlQ) host doped with coumarin dyes for green emitting OLEDs; and AlQ doped with 4-dicyanomethylene-4H-pyrans (DCMs) for orange-red emitting OLEDs. In addition to enhancements in color and luminance efficiency, there are other significant benefits in using a doped luminescent layer. Shi et al., in commonly-assigned U.S. Pat. No. 5,593,788, disclosed that the use of a doped luminescent layer significantly improved the stability of OLED devices. In Shi's disclosure, a long operational life was obtained in an OLED device by using a quinacridone compound as the dopant in an AlQ host. The quinacridone dopant produced a green emission with a high luminance efficiency. Bryan et al., in commonly-assigned U.S. Pat. No. 5,141,671, disclosed a luminescent layer containing perylene or a perylene derivative as a dopant in a blue emitting host. They showed that a blue emitting OLED device with an improved blue hue and an improved operational stability was obtained. In both disclosures, the incorporation of selected fluorescent dopants in the luminescent layer is found to improve substantially the overall OLED device performance parameters.

The most common formulation of the doped luminescent layer includes only a single dopant in a host matrix. However, in a few instances, incorporation of more than one dopant in the luminescent layer was found to be beneficial in improving the hue. One such instance was reported by Hamada et al. in Applied Phys. Lett. 75, 1682 (1999). Using a luminescent layer containing rubrene, a yellow emitting dopant, and DCJ 4-(dicyanomethylene)-2-methyl-6-[2-(4-julolidyl)ethenyl]-4H-pyran, a red emitting dopant, in an AlQ host, Hamada et al. were able to produce a red emitting OLED device with excellent chromaticity. Furthermore, the red hue from the DCJ dopant remains essentially unchanged regardless of the intensity of light output from the OLED. In contrast, with only DCJ dopant in the AlQ host, the color of the light emitted from the dopant DCJ was noticeably blue-shifted, producing a less than desirable orange, rather than red, hue. With the dual dopant system, rubrene functions as a co-dopant in mediating energy transfer from the AlQ host to the DCJ emitter. In either single dopant or dual dopant systems, it has been noted that the luminance efficiency tends to decrease with increasing brightness, i.e. with increasing current density. With red-emitting dopants, the hue usually shifts towards orange with increasing current density.

Although EL efficiency, color, and stability have been improved significantly using doped luminescent layers of various compositions, the problem of decreasing EL efficiency with increasing light output or drive current density persists, particularly in red-emitting OLED devices.

SUMMARY OF THE INVENTION

It is an object of the present invention to provide OLED devices with improved luminance efficiency that is essentially independent of the intensity of the light output from the OLED.

It is another object of the present invention to provide specifically red OLED devices with an improved luminance efficiency that is essentially independent of the intensity of the light output.

It is a further object of the present invention to provide specifically red OLED devices with chromaticity essentially independent of the light output.

These objects are achieved in an organic light emitting device comprising:
(a) a substrate;
(b) an anode and a cathode disposed over the substrate;
(c) a luminescent layer disposed between the anode and the cathode wherein the luminescent layer includes a host and at least one dopant;
(d) the host of the luminescent layer being selected to include a solid organic material comprising a mixture of at least two components wherein;
  (i) the first component of the mixture is an organic compound that is capable of transporting both electrons and holes and that is substantially non-polar; and
  (ii) the second component of the mixture is an organic compound that is more polar than the first component; and
(e) the dopant of the luminescent layer being selected to produce light from the light emitting device.

An advantage of the present invention is that, with an appropriate selection of the first and second host components and the dopants in the luminescent layer, OLED devices with high luminance efficiencies are produced.

Another advantage of the present invention is that it provides OLED devices with a luminance efficiency which is relatively independent of the intensity of the light output from the OLED.

Another advantage of the present invention is that it provides an OLED device with a chromaticity essentially independent of the intensity of the light output from the OLED.

Another advantage of the present invention is that it provides a red emitting OLED with excellent efficiency and chromaticity.

BRIEF DESCRIPTION OF THE DRAWINGS

The drawings are necessarily of a schematic nature, since the individual layers are too thin and the thickness differences of the various elements too great to permit depiction to scale or to permit convenient proportionate scaling.

DETAILED DESCRIPTION OF THE INVENTION

Figure 1:
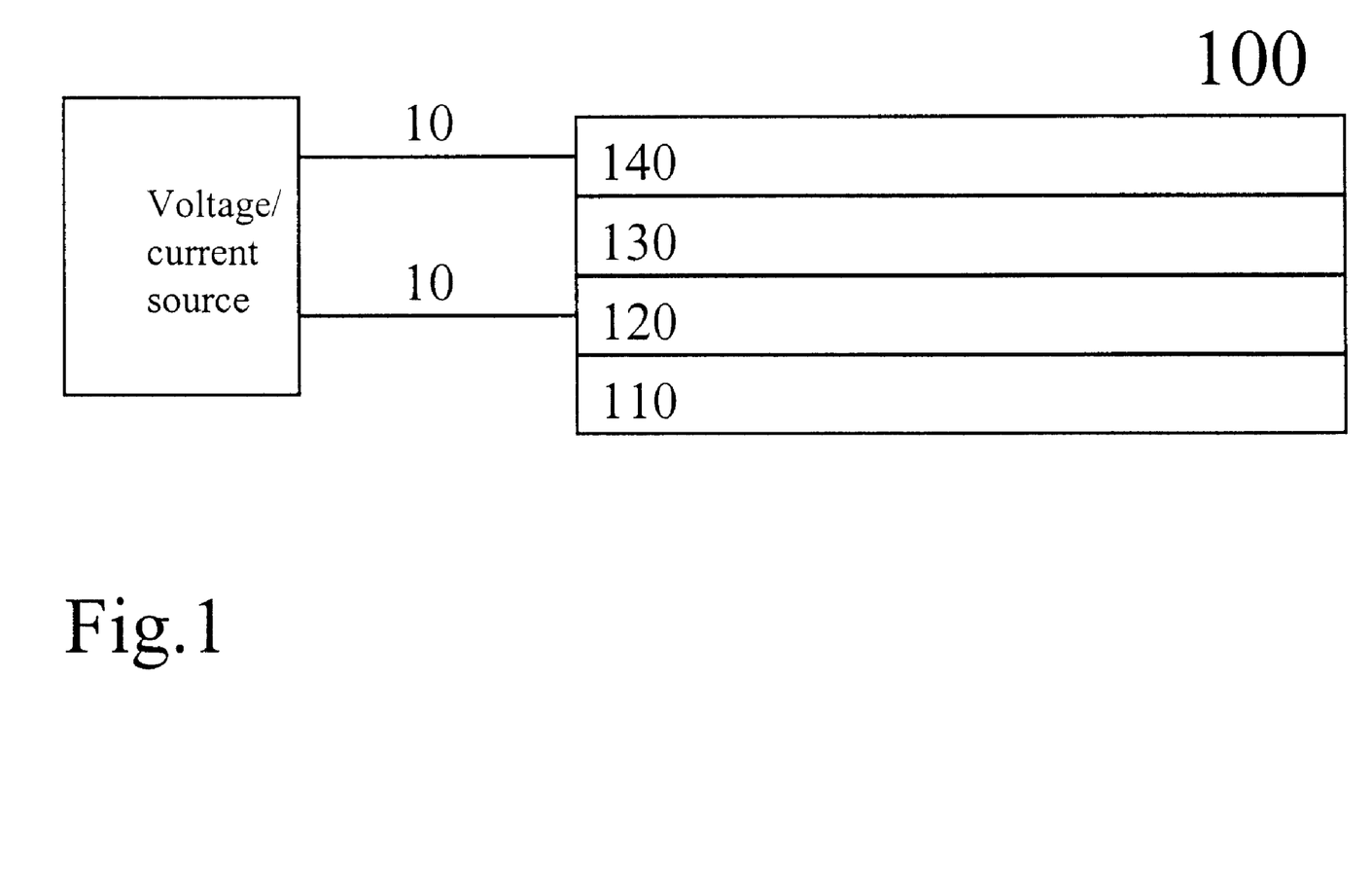
FIG. 1 is schematic structure of an OLED with an organic EL medium.

FIG. 1 illustrates the structure of an OLED device of the simplest construction practiced in the present invention. In this structure, OLED device 100 includes an anode 120, an EL medium 130, and a cathode 140, disposed upon a substrate 110. In operation, an electrical current is passed through the OLED by connecting an external current or voltage source with electrical conductors 10 to the anode and the cathode, causing light to be emitted from the EL medium. The light may exit through either the anode or the cathode or both as desired and depending on their optical transparencies. The EL medium includes a single layer or a multi-layer of organic materials.

Figure 2:
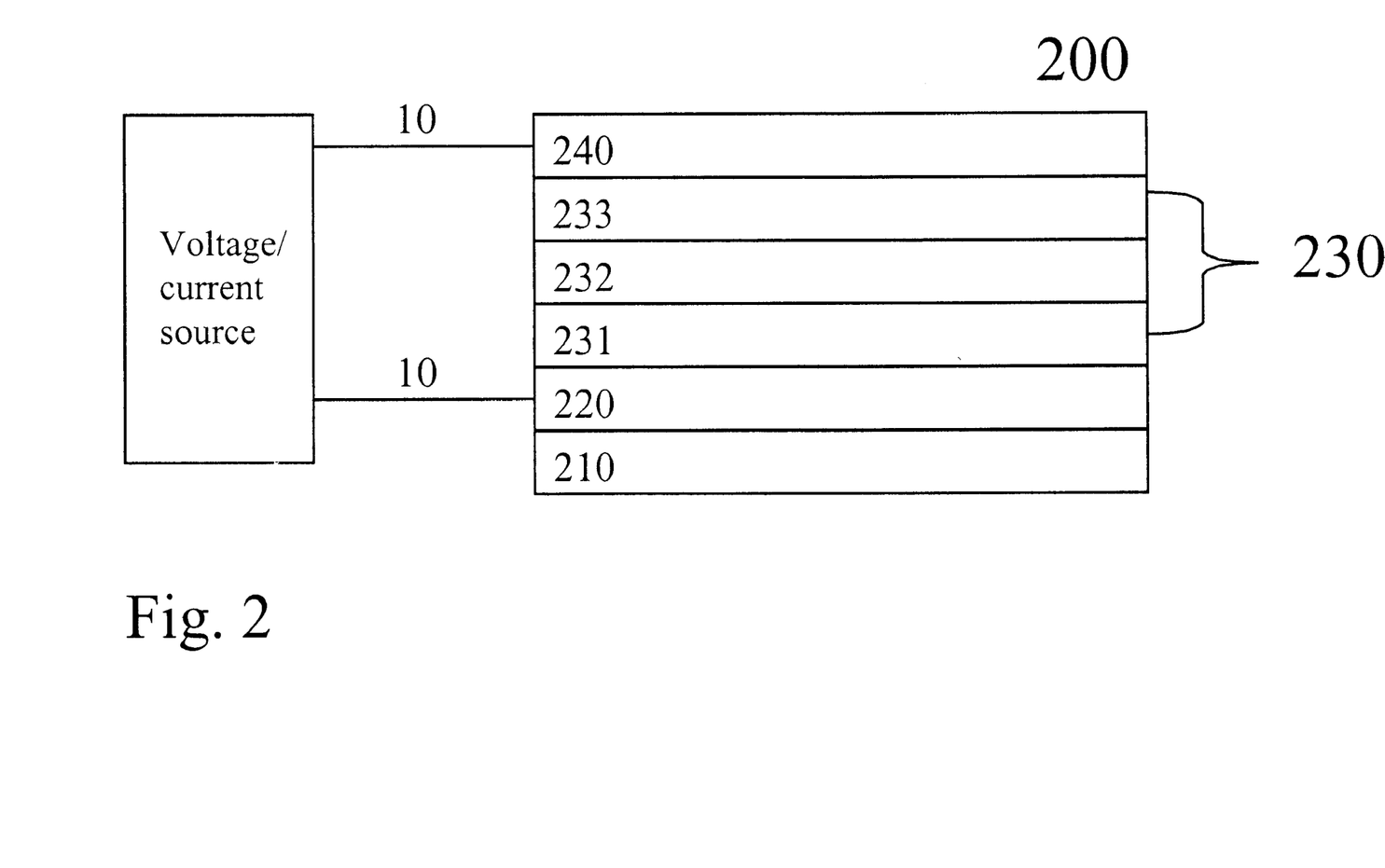
FIG. 2 and FIG. 3 are two schematic OLED structures showing two different configurations of the organic EL medium.

FIG. 2 rates the structure of another OLED device of the present ion. In this structure, OLED device 200 includes a substrate 210 and an EL medium 230, disposed between anode 220 and cathode 240. EL medium 230 includes a hole-transport layer 231 adjacent to the anode, an electron transport layer 233 adjacent to the cathode, and a luminescent layer 232 disposed between the hole-transport layer and the electron-transport layer. In operation, an electrical current is passed through the OLED device by connecting an external current or voltage source with electrical conductors 10 to the anode and the cathode. This electrical current, passing through the EL medium, causes light to be emitted primarily from the luminescent layer 232. Hole-transport layer 231 carries the holes, that is, positive electronic charge carriers, from the anode to the luminescent layer. Electron-transport layer 233 carries the electrons, that is, negative electronic charge carriers, from the cathode to the luminescent layer 232. The recombination of holes and electrons produces light emission, that is, electroluminescence, from the luminescent layer 232.

Figure 3:
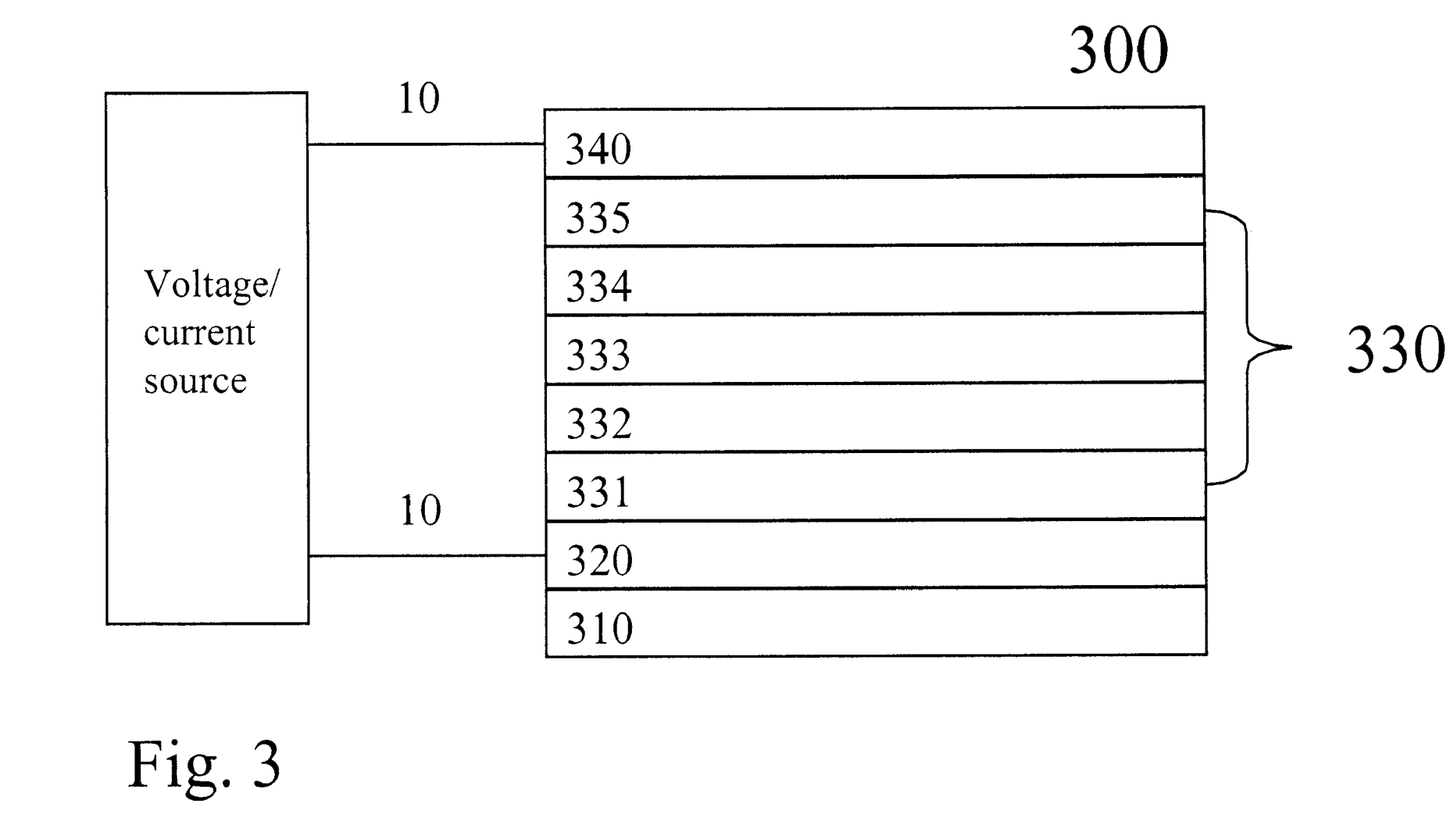

FIG. 3 illustrates yet another structure of an OLED device of the present invention. In this structure, OLED device 300 includes a substrate 310 and an EL medium 330 disposed between anode 320 and cathode 340. EL medium 330 includes a hole injection layer 331, a hole transport layer 332, a luminescent layer 333, an electron transport layer 334, and an electron injection layer 335. Similarly to OLED device 200 of FIG. 2, the recombination of electrons and holes produces emission from the luminescent layer 333. The provision of the hole-injection layer 331 and the electron injection layer 335 serves to reduce the barriers for carrier injection from the respective electrodes. Consequently, the drive voltage required for the OLED device can be reduced.

According to the present invention, the luminescent layer (either layer 232 of FIG. 2 or layer 333 of FIG. 3) is primarily responsible for the electroluminescence emitted from the OLED device. One of the most commonly used formulations for this luminescent layer is an organic thin film including a host and one or more dopants. The host serves as the solid medium or matrix for the transport and recombination of charge carriers injected from the anode and the cathode. The dopant, usually homogeneously distributed in the host in small quantity, provides the emission centers where light is generated. Following the teaching of the prior art, the present invention uses a luminescent layer including a host and a dopant, but it distinguishes over the prior art that the host of the present invention is a mixture having at least two components, each component having specific electronic properties. The selection of these host components and compatible dopant materials is in accordance with the following criteria:

1. The host is a solid organic thin film having at least two uniformly mixed host components;
2. The first host component is an organic compound capable of transporting both electrons and holes, and the molecular structure of this organic compound is substantially non-polar;
3. The second host component is an organic compound having a molecular structure more polar than that of the first host component.
4. The dopant is an organic luminescent compound capable of accepting the energy released from the recombination of electrons and holes in either the first or second host components, and emitting the energy as light.

Following the selection criteria of this invention, OLED devices have been constructed having excellent luminance efficiency and chromaticity. More importantly, the luminance efficiency measured in candelas per ampere is essentially constant over a large range of brightness or current densities. This is a distinct advantage over the prior art, where the luminance efficiency often decreases, or otherwise varies, with increasing brightness or current density. Another important advantage is that the chromaticity also remains essentially constant, independent of the brightness or current density. Thus, the problem of color shift with brightness in an OLED device is eliminated.

Preferred materials for the first host component of the luminescent layer of this invention include a class of compounds which, for the purpose of this invention, will be referred to as benzenoid compounds. The benzenoid compounds comprise polycyclic hydrocarbons (PAH) and combinations of two or more PAH. In benzenoid compounds formed by combination of two or more PAH, the PAH are connected together via a single chemical bond or linked via a saturated or unsaturated hydrocarbon group. The list of PAH useful as building blocks for benzenoid compounds includes:

1. Benzene
2. Naphthalene
3. Anthracene
4. Phenanthrene
5. Tetracene
6. Pyrene
7. Pentacene
8. Perylene
9. Coronene
10. Chrysene
11. Picene
12. Pericyclene

Any of the above listed PAH, and any benzenoid compounds formed by the combination of one or more of the above listed PAH, are useful as the first host component, provided that the compounds are also film-forming materials at room temperature. Benzenoid compounds containing a total of 5 or more six-membered rings in PAH groups are usually film-forming.

Representative examples of useful benzenoid compounds in which the PAH are connected together via single chemical bonds include:
1) Hexaphenylbenzene
2) Benzene-anthracene-benzene (e.g. 9,10-diphenylanthracene)
3) Naphthalene-anthracene-naphthalene. (e.g. 9,10-bis(2-naphthyl)anthracene)
4) (Benzene)$_2$-tetracene-(benzene)$_2$ (e.g. rubrene)
5) Anthracene-anthracene (e.g., bianthryl)
6) Anthracene-anthracene-anthracene (e.g., 9,10-dianthrylanthracene)
7) Pyrene-perylene
8) Perylene-anthracene

In the above examples, a hyphen represents a single chemical bond between PAH moieties. Useful benzenoid compounds include compounds including PAH groups linked by one or more hydrocarbon groups. Any of the above benzenoid compounds substituted with one or more hydrocarbon groups are useful.

Particularly preferred materials for the first host component of the luminescent layer of this invention include benzenoid compounds of the following structure:

wherein:
substituents $R^1$, $R^2$, $R^3$ and $R^4$ are each individually hydrogen, or alkyl of from 1 to 24 carbon atoms, or aryl, or substituted aryl of from 5 to 30 carbon atoms.

The chemical names and their abbreviations of specific examples of the particularly preferred materials include:

9,10-Diphenylanthracene (DPA)

9,10-Bis(2-naphthalenyl)anthracene (ADN)

2-(1,1-dimethylethyl)-9,10-bis(2-naphthalenyl) anthracene (TBADN)

9,10-Bis[4-(2,2-diphenylethenyl)phenyl]anthracene

One particular selection criterion for the first host component is that the organic compound should have a molecular structure that is substantially non-polar. The polarity of a compound is a measure of the distribution of electrical charge in the molecule. A non-polar or substantially non-polar molecule has a structure wherein every atom is approximately electrically neutral. In contrast, a polar compound has a molecular structure wherein some atoms have a partial positive or negative charge. The polarity of a molecule can, in some instances, be indicated by the magnitude of the dipole moment, defined in units of Debye. For reference, the values of the dipole moments of a large number of organic compounds can be found in the Handbook of Chemistry and Physics, 51st edition, page E70. A non-polar molecule usually has a dipole moment less than 1.0 Debye.

For some organic compounds, the molecular structure is such that the average dipole moment of the molecule can be relatively small even though the molecular structure may contain various moieties or group of atoms that are rather polar as individual groups. The reason is that the dipole moments of the individual moieties within the molecular structure may oppose each other, resulting in cancellation of these dipole moments. The values of the dipole moment of various groups of atoms within a molecule, known as group dipole moments, can be found in the book Dipole Moments in Organic Chemistry by V. I. Minkin, O. A. Osipov, and Y. A. Zhdanov. Further examples of the use of net and group dipole moments to describe the nonpolar or polar character of molecules useful in OLED are available in Young and Fitzgerald, Journal of Physical Chemistry, 99, 4230 (1995).

As used herein, the dipole moment of a moiety or a group of atoms within a molecule is referred to as the group dipole moment. The dipole moment of the entire molecule is termed the net dipole moment of the molecule. For an organic compound to be substantially non-polar as used herein, the group dipole moments or the net dipole moment of a molecule should be less than one Debye.

Almost all benzenoid compounds found useful as the first host component in the present invention have a dipole moment of less than one Debye, and groups of atoms within these compounds also have dipole moments of less than one Debye. Many representative benzenoids, such as naphthalene, anthracene, and perylene, have practically zero group and net dipole moments. Other organic compounds meeting such a non-polar criteria are useful as well.

Materials for the second host component of the luminescent layer of the present invention include organic compounds that have a dipole moment that is higher than that of the first host component. As defined previously, the values of the net dipole moment and the group dipole moment of a molecule can be quite different. For an organic compound to be useful as the second host component, it is only necessary that any individual group dipole moment or net dipole moment of the molecule be greater than any individual group dipole moment or net dipole moment of the molecule used for the first host component. The value of 0.5 Debye or larger is preferred for the individual group or net dipole moment for molecules useful as the second host component in the luminescent layer.

Preferably the second host component should have a bandgap that is less than that of the first host component. The bandgap is defined as the energy needed to bring an electron from the highest occupied molecular orbital to the lowest unoccupied molecular orbital of the molecule. This condition ensures that energy transfer from the first host component to the second host component is favorable and the energy resulting from the recombination of electrons and holes in the first host component can be transferred to the second host component and subsequently to the light producing dopants.

Another reason for selecting a material of lower bandgap for the second host component is that it may also serve as a hole trap, an electron trap, or both. Trapping injected carriers directly in the second host component is beneficial as it promotes electron-hole recombination in this component, shortcutting the need for carrier recombination in the first host component. Under this condition, the first host component is needed for carrier transport only.

Materials useful as the second host component in the luminescent layer include benzenoids that are rendered more polar with one or more electron-donating or electron-withdrawing moieties in the molecular structure. Electron-donating moieties include: amino, alkylamino, arylamino, dialkylamino, diarylamino, methoxy, and phenoxy. Electron-withdrawing moieties include: cyano, nitro, fluoro, chloro, keto, carboxyl, and pyridyl.

Another class of materials useful as the second host component includes benzenoids that contain heterocyclic structures. These structures include benzoxazolyl, and thio and amino analogs of benzoxazolyl of following general molecular structure:

wherein
  Z is O, NR" or S;
  R and R', are individually hydrogen; alkyl of from 1 to 24 carbon atoms; aryl or hetero-atom substituted aryl of from 5 to 20 carbon atoms; halo, or atoms necessary to complete a fused aromatic ring; and R" is hydrogen; alkyl of from 1 to 24 carbon atoms; or aryl of from 5 to 20 carbon atoms.

The dipole moment for the benzimidazole group of this structure is estimated to be approximately 4 Debye from reported literature [Tables of Experimental Dipole Moments, edited by A. L. McClellan, Freeman, 1963, Page 238].

Another preferred class of materials for the second host component is the oxinoid compounds. Exemplary of contemplated oxinoid compounds are those satisfying the following structural formula:

wherein
  Me represents a metal;
  n is an integer of from 1 to 3; and
  Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds and their abbreviated names are the following:
  Tris(8-quinolinol)aluminum (AlQ)
  Bis(8-quinolinol)-magnesium (MgQ)
  Tris(8-quinolinol)indium (InQ)
  8-quinolinol lithium (LiQ)

The material selection criteria for the dopant in the luminescent layer are: 1) the dopant molecule has a high efficiency of fluorescence or phosphorescence in the luminescent layer, and 2) it has a bandgap smaller than that of the both the first and second host materials.

For red emitting OLEDs, a preferred class of dopants of this invention has the general formula:

wherein:
  $R^1$, $R^2$, $R^3$, and $R^4$ are individually alkyl of from 1 to 10 carbon atoms;

$R^5$ is alkyl of from 2 to 20 carbon atoms, aryl, sterically hindered aryl, or heteroaryl;

and $R^6$ is alkyl of from 1 to 10 carbon atoms, or a 5- or 6-membered carbocyclic ring connecting with $R^5$.

These materials possess fluorescence efficiencies as high as unity in solutions and emit in the orange-red spectral region. Representative materials of this class and their abbreviated names include:

DCM

DCJ

DCJT

DCJTB

Another class of fluorescent materials that are useful as the dopant in the present invention includes compounds of the formula:

wherein:

X=S, or O

$R_1$ and $R_2$ are individually alkyl of from 1 to 20 carbon atoms, aryl or carbocyclic systems;

$R_3$ and $R_4$ are individually alkyl of from 1 to 10 carbon atoms, or a branched or unbranched 5 or 6 member substituent ring connecting with $R_1$, $R_2$ respectively; and

$R_5$ and $R_6$ are individually alkyl of from 1 to 20 carbon atoms, which are branched or unbranched.

Representative materials of this class and their abbreviated names include:

C-545T

C-6

C-525T

The composition of the luminescent layer of this invention is such that the first host component constitutes the largest volume fraction, followed by the second host component. The dopant constitutes the smallest volume fraction. The preferred range for the first host component is no more than 95% but no less than about 50% by volume. The preferred concentration range for the second host component is no more than about 40% but no less than about 5% by volume. The preferred concentration range for the dopant is between 0.1% to 10% by volume. The thickness of the luminescent layer useful in this invention is between 50 Angstroms and 2000 Angstroms. A thickness in this range is sufficiently large to enable recombination of charge carriers and, therefore, electroluminescence to take place exclusively in this layer. A preferred range is between 100 Angstroms and 500 Angstroms, where the overall OLED device performance parameters, including drive voltage, are optimal.

A useful method for forming the luminescent layer of the present invention is by vapor deposition in a vacuum chamber. This method is particularly useful for fabricating OLED devices, where the layer structure, including the organic layers, can be sequentially deposited on a substrate without significant interference among the layers. The thickness of each individual layer and its composition can be precisely controlled in the deposition process. To produce the desired composition of the luminescent layer, the rate of deposition for each component is independently controlled using a deposition rate monitor.

Returning to FIG. 2, hole-transport layer 231 and electron-transport layer 233 provide the functions of transporting holes and electrons, respectively, to the luminescent layer 232. The use of these layers and their material compositions in OLED devices have been disclosed by Tang et al in commonly-assigned U.S. Pat. No. 4,769,292, included herein by reference. A typical hole-transport layer includes the hole-transporting compound NPB, N,N'-bis(1-naphthyl)-N,N'-diphenylbenzidine.

Returning to FIG. 3, hole-injection layer 331 and electron-injection layer 335 provide the functions of improving the hole injection from the anode and electron injection from the cathode 340, respectively. The use of a hole-injection layer in OLED devices has been disclosed by Van Slyke et al. in commonly-assigned U.S. Pat. No. 4,720,432, included herein by reference. The use of an electron-injection layer has been disclosed by Hung et al in commonly-assigned U.S. Pat. No. 5,776,622, also included herein by reference.

Comparative Example 1

An OLED device was prepared as follows. A glass substrate coated with a transparent indium-tin-oxide (ITO) conductive layer was cleaned and dried using a commercial glass scrubber tool. The ITO surface was subsequently treated with an oxidative plasma to condition the surface as an anode. The following layers were deposited in the following sequence by sublimation from a heated crucible boat in a conventional vacuum deposition chamber under a vacuum of approximately $10^{-6}$ torr: (1) a hole-transport layer, 700 Å thick, consisting of NPB, (2) a luminescent layer, 350 Å thick, consisting of TBADN as the sole host material and 1% DCJTB as the dopant, (3) an electron-transport layer, 400 Å thick, consisting of AlQ, and (4) a cathode, approximately 2200 Å thick, consisting of an alloy of magnesium and silver with a Mg:Ag volume ratio of about 10:1.

The EL characteristics of this device were evaluated using a constant current source and a photometer. The efficiency, CIE coordinates, and drive voltage at a relatively low current density, 1 mA/cm², and a relatively high current density, 100 mA/cm², were measured. Their values are shown in Table I.

EXAMPLE 2

An OLED device similar to that of Comparative Example 1 was constructed, except that in the luminescent layer, TBADN is the material for the first host component, AlQ is the material for the second host component, and DCJTB is the fluorescent dopant. The relative amounts of TBADN, AlQ, and DCJTB on a volume basis are in the ratio 89:10:1. The EL characteristics of this device are also shown in Table I.

EXAMPLE 3–5

OLED devices similar to that of Example 2 were constructed, except that the relative amounts of TBADN, AlQ, and DCJTB in the luminescent layer are in the ratio 74:25:1 for Example 3, 49:50:1 for Example 4, and 25:74:1 for Example 5. The EL characteristics of these devices are also shown in Table I.

Comparative Example 6

An OLED device similar to that of Comparative Example 1 was constructed, except that the sole host material in the luminescent layer was AlQ rather than TBADN. The EL characteristics of this device are also shown in Table I.

TABLE I

Compositions and EL properties of OLED devices of Example 1–6

| Example | First host TBADN Vol % | Second host AlQ Vol % | Dopant DCJTB Vol % | Current density (mA/cm$^2$) | Efficiency (cd/A) | CIEx | CIEy | Drive voltage (V) |
|---|---|---|---|---|---|---|---|---|
| 1 | 99 | 0 | 1 | 1 | 3.54 | 0.534 | 0.448 | 4.1 |
|   |    |   |   | 100 | 3.85 | 0.521 | 0.457 | 9.6 |
| 2 | 89 | 10 | 1 | 1 | 5.93 | 0.603 | 0.392 | 5.6 |
|   |    |    |   | 100 | 4.98 | 0.595 | 0.399 | 11.2 |
| 3 | 74 | 25 | 1 | 1 | 5.75 | 0.615 | 0.381 | 5.6 |
|   |    |    |   | 100 | 4.62 | 0.606 | 0.388 | 11.3 |
| 4 | 49 | 50 | 1 | 1 | 4.73 | 0.629 | 0.368 | 5.7 |
|   |    |    |   | 100 | 3.53 | 0.620 | 0.376 | 11.5 |
| 5 | 25 | 74 | 1 | 1 | 3.35 | 0.642 | 0.356 | 6.4 |
|   |    |    |   | 100 | 2.45 | 0.629 | 0.366 | 12.2 |
| 6 | 0 | 99 | 1 | 1 | 2.49 | 0.648 | 0.350 | 6.9 |
|   |   |    |   | 100 | 1.60 | 0.628 | 0.368 | 12.3 |

Comparative Examples 1 and 6 show that the luminance efficiency of an OLED device using a single host material is relatively low: less than 4 cd/A for Example 1 where the sole host material is TBADN, and less than 2.5 cd/A for Example 6 where the sole host material is AlQ. In contrast, the luminance efficiency of an OLED device with a mixture of first and second host materials is significantly higher: above 3 cd/A for all examples and as high as 5.93 cd/A for Example 2. In Examples 2–5, the first host material, TBADN, is a substantially nonpolar benzenoid hydrocarbon. The second host material, AlQ, is relatively polar, with a dipole moment of 5.5 Debye. The bandgap values for TBADN, AlQ, and DCJTB are respectively, 3.2, 2.8, and 2.4 electron volts The luminance efficiency at both low and high current densities is generally the highest in OLED devices with a mixture of host components in the luminescent layer [Examples 2, 3, 4]. For OLED devices with a single host component [Comparative Examples 1 and 6], the luminance efficiencies are considerably lower. Moreover, the OLED device of Example 6 exhibits a major drop in luminance efficiency with increasing current density. In addition, according to the color coordinates CIEx and CIEy, the color of the OLED devices is red shifted with increasing concentration of the second host component in the luminescent layer.

EXAMPLE 7–10

OLED devices similar to those of Examples 2–5 were constructed, except that the first host material is ADN. Again, the second host material is AlQ, and the fluorescent dopant is DCJTB. The composition of the luminescent layer and the EL characteristics of these devices are shown in Table II. Conclusions similar to those drawn for TBADN:AlQ in Examples 1–6 can be made for the ADN:AlQ mixed host.

TABLE II

Compositions and EL properties of OLED devices of Examples 7–10

| Example | First host ADN Vol % | Second host AlQ Vol % | Dopant DCJTB Vol % | Current density (mA/cm$^2$) | Efficiency (cd/A) | CIEx | CIEy | Drive voltage (V) |
|---|---|---|---|---|---|---|---|---|
| 7 | 89 | 10 | 1 | 1 | 6.27 | 0.621 | 0.376 | 6.9 |
|   |    |    |   | 100 | 6.15 | 0.614 | 0.382 | 13.0 |
| 8 | 74 | 25 | 1 | 1 | 5.78 | 0.626 | 0.371 | 7.0 |
|   |    |    |   | 100 | 5.47 | 0.618 | 0.378 | 12.8 |
| 9 | 49 | 50 | 1 | 1 | 5.26 | 0.633 | 0.365 | 6.8 |
|   |    |    |   | 100 | 4.41 | 0.622 | 0.374 | 12.5 |
| 10 | 25 | 74 | 1 | 1 | 4.59 | 0.635 | 0.362 | 6.8 |
|    |    |    |   | 100 | 3.25 | 0.622 | 0.374 | 12.4 |

Comparative Example 11

An OLED device similar to that of Comparative Example 1 was constructed, except that the sole host material in the luminescent layer was ADN rather than TBADN, and the fluorescent dopant was C-545T rather than DCJTB. The EL characteristics of this device are shown in Table III.

EXAMPLES 12–14

OLED devices similar to that of Comparative Example 11 were constructed, except that the material for the first component in the luminescent layer is ADN, and the material for the second host component is AlQ. The composition of the luminescent layer and the EL characteristics of these devices are shown in Table III.

TABLE III

Compositions and EL properties of OLED devices of Examples 11–14.

| Example | First host ADN Vol % | Second host AlQ Vol % | Dopant C-545T Vol % | Current density (mA/cm$^2$) | Efficiency (cd/A) | CIEx | CIEy | Drive voltage (V) |
|---|---|---|---|---|---|---|---|---|
| 11 | 99 | 0 | 1 | 1 | 2.57 | 0.244 | 0.608 | 5.0 |
|  |  |  |  | 100 | 4.83 | 0.241 | 0.604 | 8.1 |
| 12 | 94 | 5 | 1 | 1 | 4.1 | 0.254 | 0.634 | 4.7 |
|  |  |  |  | 100 | 6.2 | 0.253 | 0.631 | 7.9 |
| 13 | 89 | 10 | 1 | 1 | 5.4 | 0.255 | 0.638 | 4.5 |
|  |  |  |  | 100 | 6.7 | 0.254 | 0.636 | 8.0 |
| 14 | 79 | 20 | 1 | 1 | 6.9 | 0.261 | 0.647 | 4.2 |
|  |  |  |  | 100 | 7.3 | 0.259 | 0.645 | 7.5 |

Comparison of Examples 12–14 with Comparative Example 11 shows that the luminance efficiency of an OLED device using a mixture of ADN and AlQ as first and second host materials is considerably higher than that using ADN as the sole host material. In addition, the CIEx and CIEy coordinates indicate a more saturated green hue.

The invention has been described in detail with particular reference to certain preferred embodiments thereof, but it will be understood that variations and modifications can be effected within the spirit and scope of the invention.

Parts List

10 Electrical conductors
100 OLED device
110 Substrate
120 Anode
130 EL medium
140 Cathode
200 OLED device
210 Substrate
220 Anode
230 EL medium
231 Hole-transport layer
232 Luminescent layer
233 Electron-transport layer
240 Cathode
300 OLED device
310 Substrate
320 Anode
330 EL medium
331 Hole-injection layer
332 Hole-transport layer
333 Luminescent layer
334 Electron transport layer
335 Electron injection layer
340 Cathode

What is claimed:

1. An organic light emitting device comprising:
   (a) a substrate,
   (b) an anode and a cathode disposed over the substrate;
   (c) a luminescent layer disposed between the anode and the cathode wherein the luminescent layer includes a host and at least one dopant;
   (d) the host of the luminescent layer being selected to include a solid organic material comprising a mixture of at least two components wherein;
      (i) the first component of the mixture is a benzenoid compound that is capable of transporting both electrons and holes and that is substantially non-polar; and
      (ii) the second component of the mixture is an organic compound that is more polar than the first component, said second component being either a heterocyclic benzenoid having as a component the molecular structure wherein
Z is O, NR" or S;
R and R', are individually hydrogen; alkyl of from 1 to 24 carbon atoms; aryl or hetero-atom substituted aryl of from 5 to 20 carbon atoms; halo, or atoms necessary to complete a lined aromatic ring; and R" is hydrogen alkyl of from 1 to 24 carbon atoms; or aryl of from 5 to 20 carbon atoms, or an oxinoid compound having the molecular structure:

wherein
Me represents a metal;
n is an integer of from 1 to 3; and
Z independently in each occurrence represents the atoms completing a nucleus having at least two fused aromatic rings; and
   (e) the dopant of the luminescent layer is selected to produce light from the light emitting device.

2. The organic light emitting device of claim 1 wherein the second component has a bandgap that is smaller than that of the first component.

3. The organic light emitting device of claim 1 wherein the dopant of the luminescent layer has a bandgap that is smaller than those of the first and second host components.

4. The organic light emitting device of claim 1 wherein the dipole moment of the first component is less than 1 Debye.

5. The organic light emitting device of claim 1 wherein the dipole moment of the second component is greater than 0.5 Debye.

6. The organic light emitting device of claim 1 wherein the dipole moment of a moiety within the second component is greater than 0.5 Debye.

7. The organic light emitting device of claim 1 wherein the dopant is a luminescent organic compound.

8. The organic light emitting device of claim 1 wherein the first host component includes said benzenoid compound and the second component includes said oxinoid compound.

9. The organic light emitting device of claim 1, wherein the benzenoid compound has the formula;

wherein:
  substituents $R^1$, $R^2$, $R^3$ and $R^4$ are each individually hydrogen. alkyl of from 1 to 24 carbon atoms, aryl, or substituted aryl of from 5 to 30 carbon atoms.

10. The organic light emitting device of claim 1 wherein the first component includes:

9,10-Diphenylanthracene (DPA);

9,10-Bis(2-naphthalenyl)anthracene (ADN);

2-(1,1-dimethylethyl)-9,10-bis(2-naphthalenyl) anthracene (TBADN); or 9,10-Bis[4-(2,2-diphenylethenyl)phenyl]anthracene.

11. The organic light emitting device of claim 1 wherein the second component includes a benzenoid substituted an electron-donating or an electron-withdrawing moiety.

12. The organic light emitting device of claim 1 wherein the second component includes an organic compound of molecular structure:

wherein
  Me represents a metal;
  n is an integer of from 1 to 3; and
  Z independently in each occurrence represents the atoms completing a nucleus having at least two fused aromatic rings.

13. The organic light emitting device of claim 12 wherein the second component includes AlQ, InQ, GaQ, or MgQ.

14. The organic light emitting device of claim 1 wherein the dopant comprises a compound of the formula:

wherein:
  $R^1$, $R^2$, $R^3$, and $R^4$ are individually alkyl of from 1 to 10 carbon atoms;
  $R^5$ is alkyl of from 2–20 carbon atoms, aryl, or heteroaryl;
  and $R^6$ is alkyl of from 1 to 10 carbon atoms, or a 5- or 6-membered carbocyclic ring connecting with $R^5$.

15. The organic light emitting device of claim 14 wherein the dopant includes DCM, DCJT, or DCJTB.

16. The organic light emitting device of claim 1 wherein the dopant includes compounds of structure:

wherein:
  X=S, or O
  $R_1$ and $R_2$ are individually alkyl of from 1 to 20 carbon atoms, aryl or carbocyclic moieties;
  $R_3$ and $R_4$ are individually alkyl of from 1 to 10 carbon atoms, or a 5 or 6 member substituent ring connecting with $R_1$, $R_2$ respectively; and
  $R_5$ and $R_6$ are individually alkyl of from 1 to 20 carbon atoms.

17. The organic light emitting device of claim 16 wherein the dopant includes C-6, C-545T, or C-525T.

18. An organic light emitting device comprising:
(a) a substrate;
(b) an anode and a cathode disposed over the substrate;
(c) a luminescent layer disposed between the anode and the cathode wherein the luminescent layer includes a host and at least one dopant;
(d) the host of the luminescent layer being selected to include a solid organic material comprising a mixture of at least two components wherein;
  (i) the first component of the mixture is a benzenoid compound that is capable of transporting both electrons and holes and that is substantially non-polar, said luminescent comprising at least 50% by volume of the first host component; and
  (ii) th second component of the mixture is an oganic compound that is more polar than the first component, said second component being either
  a heterocyclic benzenoid having the molecular structure wherein
Z is O, NR" or S;
R and R', are individually hydrogen; alkyl of from 1 to 24 carbon atoms; aryl or hetero-atom substituted aryl of from 5 to 20 carbon atoms; halo, or atoms necessary to complete a fused aromatic ring; and R" is hydrogen; alkyl of from 1 to 24 carbons atoms; or aryl of from 5 to 20 carbon atoms, or an oxinoid compound having the molecular structure:

wherein
Me represents a metal;
n is an integer of from 1 to 3; and
Z independently in each occurrent represents the atoms completing a nucleus having at least two fused aromatic rings; and
(e) the dopant of the luminescent layer is selected to produce light from the light emitting device.

19. The organic light-emitting device of claim 1, wherein the polycyclic hydrocarbon is selected from the group consisting of pyrene and perylene.

* * * * *

UNITED STATES PATENT AND TRADEMARK OFFICE
CERTIFICATE OF CORRECTION

PATENT NO.    : 6,720,090 B2
DATED         : April 13, 2004
INVENTOR(S)   : Jianmin Shi et al.

It is certified that error appears in the above-identified patent and that said Letters Patent is hereby corrected as shown below:

Column 15,
Lines 61-64 should read -- the first component of the mixture is a benzenoid compound that has at least five six-membered rings, that is capable of transporting both electrons and holes and that is substantially non-polar; the benzenoid compound comprising a polycylic hyrocarbon selected from the group consisting of benzene, naphthalene, phenanthrene, tetracene, pyrene, pentacene, perylene, coronene, chysene, picene, and pericyclene; and --

Column 16,
Line 31, should read -- atoms necessary to complete a fused aromatic ring; --

Column 17,
Line 66, should read -- the second component includes a benzenoid substituted with an --

Signed and Sealed this

Tenth Day of August, 2004

JON W. DUDAS
*Acting Director of the United States Patent and Trademark Office*